(12) United States Patent
Sakai

(10) Patent No.: US 6,197,118 B1
(45) Date of Patent: Mar. 6, 2001

(54) THIN FILM DEPOSITION APPARATUS

(75) Inventor: Junro Sakai, Tokyo (JP)

(73) Assignee: Anelva Corporation, Fuchu (JP)

( * ) Notice: Subject to any disclaimer, the term of this patent is extended or adjusted under 35 U.S.C. 154(b) by 0 days.

(21) Appl. No.: 09/190,130

(22) Filed: Nov. 12, 1998

(30) Foreign Application Priority Data

Nov. 16, 1997 (JP) .................................................. 9-332409

(51) Int. Cl.$^7$ .................................................. C23C 16/00
(52) U.S. Cl. .......................................... 118/715; 437/200
(58) Field of Search ............................. 118/715; 437/200

(56) References Cited

U.S. PATENT DOCUMENTS

| | | | |
|---|---|---|---|
| 5,231,056 | * 7/1993 | Sandhu | 437/200 |
| 5,234,862 | 8/1993 | Aketagawa et al. | |
| 5,366,917 | 11/1994 | Watanabe et al. | |
| 5,385,863 | 1/1995 | Tatsumi et al. | |

FOREIGN PATENT DOCUMENTS

| | | |
|---|---|---|
| 4-127519 | 4/1992 | (JP) . |
| 4-252018 | 9/1992 | (JP) . |
| 4-280669 | 10/1992 | (JP) . |
| 4-345024 | 12/1992 | (JP) . |
| 5-3161 | 1/1993 | (JP) . |
| 5-32485 | 2/1993 | (JP) . |
| 5-251355 | 9/1993 | (JP) . |
| 5-304273 | 11/1993 | (JP) . |
| 6-220643 | 8/1994 | (JP) . |
| 7-153704 | 6/1995 | (JP) . |
| 8-52341 | 2/1996 | (JP) . |

* cited by examiner

Primary Examiner—Terrel Morris
Assistant Examiner—Norca L. Torres-Velazquez
(74) Attorney, Agent, or Firm—Burns, Doane, Swecker & Mathis, LLP

(57) ABSTRACT

To suppress the deposition of thin films on exposed positions inside the process chamber and facilitate the selective deposition of good quality thin films with high productivity, disilane gas is introduced to a substrate 9 heated by a heater 4 inside a process chamber 1, and a silicon film is deposited only on the silicon surfaces of substrate 9 by thermal CVD. A heat-reflecting plate 6, which is provided inside process chamber 1 to reflect the heat radiated from substrate 9 back to the substrate, is made of silicon with a silicon oxide film 61 formed on its surface. Silicon atoms separate out and adhere to the surface of silicon oxide layer 61 through the decomposition of disilane, but a reforming operation in which oxygen gas is introduced is performed between the film deposition processing of each substrate 9, whereby the Si atoms which exist in an isolated state with no Si—Si bonds between them are converted to silicon oxide. Accordingly, the conditions for selective deposition are continuously maintained at the surface of heat-reflecting plate 6, and the deposition of a silicon film is suppressed.

11 Claims, 9 Drawing Sheets

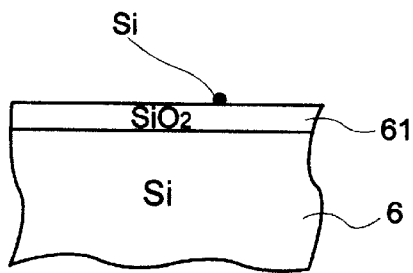
Fig. 2(1)
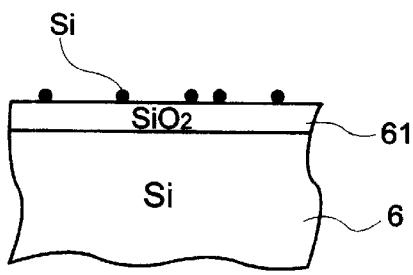
Fig. 2(2)
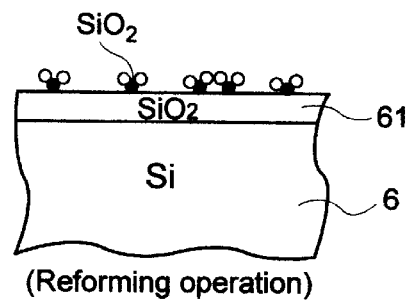
(Reforming operation)
Fig. 2(2-3')
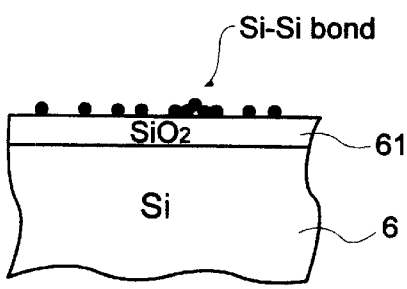
Fig. 2(3)
Prior Art
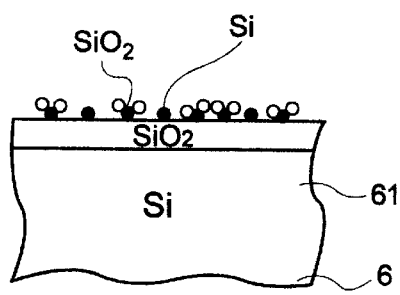
Fig. 2(3')
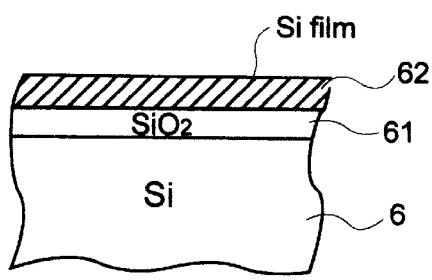
Fig. 2(4)
Prior Art
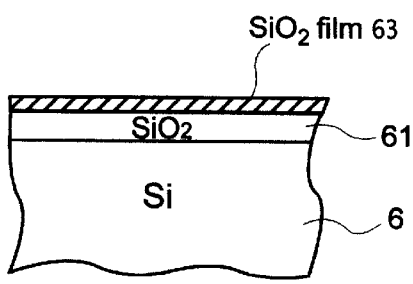
Fig. 2(4')

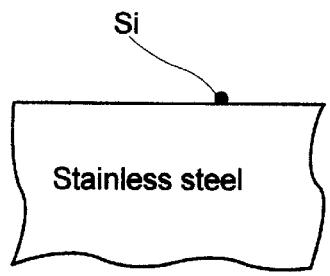
Fig. 3(1)
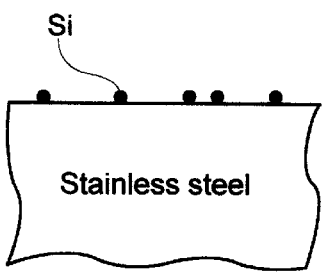
Fig. 3(2)
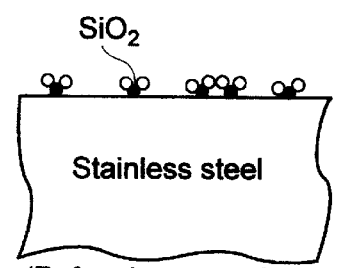
(Reforming operation)
Fig. 3(2-3')
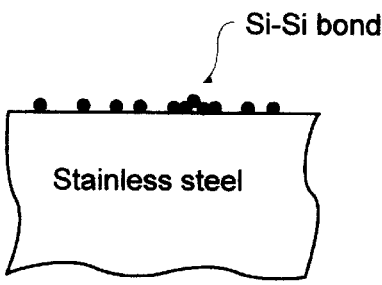
Fig. 3(3)
Prior Art
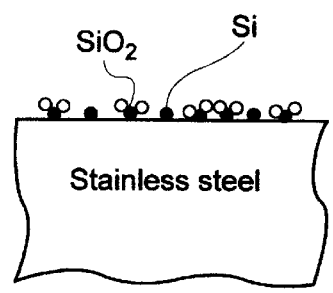
Fig. (3')
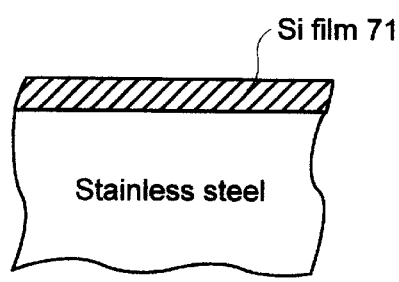
Fig. 3(4)
Prior Art
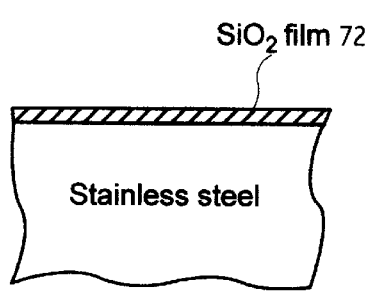
Fig. 3(4')

THIN FILM DEPOSITION APPARATUS

BACKGROUND OF THE INVENTION

1. Field of the Invention

The invention of the present application relates to a thin film deposition apparatus that produces a thin film on the surface of a semiconductor wafer substrate, and more specifically it relates to a selective deposition technique that selectively deposits a thin film only in specific regions of the substrate surface.

2. Discussion of Related Art

The deposition of thin films on the surface of semiconductor wafer substrates is frequently performed in the manufacture of various electronic devices. In particular, in the manufacture of integrated circuits such as LSIs, thin films are selectively deposited only on specific regions of the surface of a substrate. For example, a process is sometimes performed wherein a wiring pattern is formed in an insulating film of silicon oxide ($SiO_2$) or silicon nitride ($Si_3N_4$) on a silicon substrate, and a silicon film is selectively deposited only on the regions of the substrate surface where the silicon is exposed.

FIG. 5 is a front view outlining the configuration of a conventional thin film deposition apparatus used for this sort of selective deposition of silicon. The thin film deposition apparatus shown in FIG. 5 has a process chamber 1 equipped with pumping systems 11 and 12, and a gas introduction means 2 that introduces a process gas into process chamber 1. A susceptor 3 on which a substrate 9 is positioned and a heater 4 which heats substrate 9 are disposed inside process chamber 1.

The apparatus shown in FIG. 5 is a cold-wall apparatus in which the enclosure walls of process chamber 1 are fitted with a cooling mechanism (not illustrated). A first pumping system 11 which pumps down the whole interior of process chamber 1, and a second pumping system 12 which principally pumps down the region surrounding heater 4 are also provided. First and second pumping systems 11 and 12 both employ ultra-high vacuum pumping systems using turbomolecular pumps.

Gas introduction means 2 is made to introduce disilane ($Si_2H_6$)—a gaseous silicon hydride—as the process gas.

Susceptor 3 is shaped into a block which is fixed to the bottom surface of process chamber 1, and substrate 9 is mounted on its upper surface. A lift pin 5 which can be raised and lowered is provided in the interior of susceptor 3. Lift pin 5 rises and falls through a hole provided in the upper surface of susceptor 3. When mounting a substrate 9 on susceptor 3, lift pin 5 is raised up so that it projects from the upper surface of susceptor 3, and lift pin 5 is lowered after the substrate 9 has been mounted on top of lift pin 5. Substrate 9 is thereby mounted on the upper surface of susceptor 3. Susceptor 3 is formed from a material such as silicon, graphite or SiC (silicon carbide), and is made so that it contacts substrate 9 with good thermal conductivity.

A heater 4 is disposed inside susceptor 3. A heater 4 that heats substrate 9 mainly by radiative heating is used. Specifically, a carbon heater that emits heat by conducting electricity can be used. The heat radiated from heater 4 is conferred to susceptor 3, and substrate 9 is heated via susceptor 3. The temperature of substrate 9 is sensed by a thermocouple (not illustrated) and is sent to a heater control unit (not illustrated). The heater control unit performs feedback control of heater 4 according to the sensed result, whereby the temperature of substrate 9 is kept at a set temperature.

Susceptor 3 is made of the same silicon as substrate 9 to avoid contamination of substrate 9. To avoid contamination of the atmosphere inside process chamber 1 by the release of occluded gas from heater 4 when it becomes hot, second exhaust system 12 pumps down the region surrounding heater 4.

A cooling mechanism (not illustrated) is also provided at the side parts of susceptor 3. This is to prevent process chamber 1 from being heated by the conduction of heat from susceptor 3 to process chamber 1.

A heat-reflecting plate 6 is positioned above the substrate 9 mounted in susceptor 3 so as to be parallel with substrate 9. Heat-reflecting plate 6 reflects the radiation emitted from substrate 9 and susceptor 3 and returns it to substrate 9, thereby improving the efficiency with which substrate 9 is heated.

Heat-reflecting plate 6 is made of silicon. By making heat-reflecting plate 6 from the same kind of material as the film deposited on the surface of substrate 9, the thin film deposited on the surface of heat-reflecting plate 6 can be prevented from peeling away.

The silicon film deposited by thermal decomposition of a gaseous silicon hydride compound as described below is deposited not only on the surface of substrate 9 but also on heat-reflecting plate 6. If heat-reflecting plate 6 is made of a completely different material other than silicon, the thin film will have poor adhesion and can easily peel away due to internal stress. Parts of the film that peel away will form globular dust particulates that float about inside process chamber 1. If these particulates adhere to the surface of substrate 9, they will give rise to defects caused by localized reduction of the layer thickness, which are a cause of faulty products. To prevent the thin film from peeling away, heat-reflecting plate 6 uses the same silicon material as the thin film being formed.

The operation of a conventional apparatus relating to the above configuration is described next.

A substrate 9 is transferred into process chamber 1 via a gate valve 13, and is mounted on susceptor 3 by raising and lowering lift pin 5. The interior of process chamber 1 is pumped down in advance to $10^{-8}$ Torr or thereabouts by first and second pumping systems 11 and 12.

Heater 4 is operated before the film deposition begins, and the substrate 9 mounted on susceptor 3 is heated by the heat from heater 4 and maintained at the desired temperature after reaching thermal equilibrium. After this state has been achieved, gas introduction means 2 is operated and a gaseous silicon hydride compound is introduced into process chamber 1 as the process gas. The process gas diffuses inside process chamber 1 and arrives at the surface of substrate 9. The gaseous silicon hydride compound then decomposes under the heat at the surface of substrate 9, whereby a film of polycrystalline silicon is deposited at the surface.

The surface of substrate 9 has a wiring pattern formed in an insulating film of silicon oxide or silicon nitride, so that the surface contains regions of exposed silicon—the material of substrate 9—and regions where silicon oxide or silicon nitride is formed on the surface. The thermal decomposition reaction rate at the silicon surface is much higher than the thermal decomposition reaction rate at the silicon oxide film surface or silicon nitride film surface. The silicon film is thus selectively deposited only on the silicon surface. Selective deposition of silicon is thereby achieved.

FIGS. 6(1) and (2) show the results of experimental selective deposition of silicon using the conventional apparatus shown in FIG. 5. Specifically, FIGS. 6(1) and (2) show photographs of the reflection high energy diffraction (RHEED) pattern observed in film deposition using the apparatus of FIG. 5 with the temperature of substrate 9 held at 700° C. and with disilane introduced at 6 sccm. FIG. 6(1) shows the state 30 seconds after introduction of the process gas, and FIG. 6(2) shows the state after 300 seconds.

As shown in FIG. 6(1), in the state 30 seconds after introducing the gas, the pattern contains a mixture of bright vertically-extending parts and a diffuse region of brightness. The bright vertically-extending parts represent the diffraction spots from the crystalline lattice, indicating the presence of crystalline silicon at the surface of substrate 9.

On the other hand, the diffuse region of brightness represents the reflection of electrons with no periodicity from disordered (amorphous) crystals. In this case, the electrons are reflected uniformly over a wide angle, resulting in the diffuse region of brightness shown in FIG. 6(1). The halo means that amorphousness is present at the surface of substrate 9. In this case, it is considered that the surface of the silicon oxide film or silicon nitride film is already exposed at the surface of substrate 9, and that the halo observed in FIG. 6(1) is observed due to the reflection of electrons at the surface of the silicon oxide film.

As shown in FIG. 6(2), in the state 300 seconds after starting to introduce the gas, a ring-shaped diffraction pattern is observed in addition to the diffraction spots that were also seen in FIG. 6(*a*). This ring-shaped diffraction pattern is symptomatic of the deposition of a polycrystalline silicon film at the amorphous surface of the silicon oxide film. This ring-shaped diffraction pattern increases sharply in intensity during the interval between 300 and 330 seconds. Accordingly, it is considered that about 330 seconds after starting to introduce the gas, the polycrystalline silicon film covers not only the silicon surface but also the surface of the silicon oxide film.

FIGS. 7(1) and (2), like FIGS. 6(1) and (2), show the results of experimental selective deposition of silicon using the conventional apparatus shown in FIG. 5. Specifically, FIGS. 7(1) and (2) show photographs taken with a scanning electron microscope (SEM) during film deposition using the apparatus of FIG. 5 with the temperature of substrate 9 held at 700° C. and with disilane introduced at 6 sccm as in FIGS. 6(1) and (2). FIG. 7(1) shows the results observed on a substrate 9 removed from process chamber 1 60 seconds after starting to introduce the process gas, and FIG. 7(2) shows the results observed on a substrate 9 removed from process chamber 1 330 seconds after starting to introduce the process gas.

As shown in FIG. 7(1), in the state 60 seconds after starting to introduce the gas, a deposit of about 70 nm thickness is observed at the surface of the silicon. This is the epitaxial silicon layer deposited at the silicon surface. Also, no deposit is observed at the surface of the silicon oxide film. Meanwhile, as FIG. 7(2) shows, in the state 330 seconds after starting to introduce the gas a substantial polycrystalline silicon film is deposited at the surface of the silicon oxide film.

As the above results show, in the selective epitaxial deposition of silicon under the above conditions, the selective growth of silicon continues when 60 seconds have elapsed, whereas the conditions for selective epitaxial growth break down after 300 seconds have elapsed and a polycrystalline silicon film is also deposited on the surface of the silicon oxide film. This is because, although the reaction rate is much slower than on the silicon surface, a prolonged gas introduction time leads to a large cumulative quantity of gas supplied, and the disilane decomposition reaction will thus also occur on the silicon oxide film. Nonetheless, a epitaxial silicon film can still be deposited only on the silicon surface by precisely controlling the gas introduction time.

However, in the abovementioned conventional apparatus, there are exposed positions inside process chamber 1 that are similarly heated to a high temperature, like the surface of substrate 9. For example, the heat-reflecting plate 6 provided opposite substrate 9 to increase the heating efficiency receives radiated heat from substrate 9 and susceptor 3 and is heated to a high temperature in the same way as substrate 9. For example, when the distance between substrate 9 and heat-reflecting plate 6 is about 45 mm, the pressure is about $10^{-3}$ Torr, or less, and substrate 9 is heated to about 600° C., and the heat-reflecting plate 6 is also heated to about 265° C.

Since the process gas diffuses around the interior of process chamber 1, a thin film is deposited at the surfaces of parts that have thus been heated to a high temperature in the same way as the deposition on substrate 9. If the heated positions inside process chamber 1 are made of a material other than silicon, then the deposition of thin films should in principle be suppressed by a similar mechanism to that of the selective deposition on substrate 9. However, during repeated film deposition processes, the cumulative quantity of process gas supplied to the heated positions will suddenly exceed the threshold beyond which the abovementioned conditions for selective deposition break down, and thin films will also start to be deposited at the heated positions. This deposition of thin films at heated positions inside process chamber 1 gives rise to the following two problems.

The first problem is that the deposition of a thin film alters the radiation reflection conditions, causing a change in the heating conditions of substrate 9 as a result. For example, although the parts situated inside process chamber 1 are often made of stainless steel, the deposition of a silicon thin film on the surface of this stainless steel will affect the radiation reflectivity. As a result, the amount of radiation reflecting off the wall surfaces and returning to substrate 9 will change and the repeatability of temperatures attained with the same electrical power will be made less precise.

Since the reflectivity is normally reduced by the deposition of a thin film, the power supplied to heater 4 must be increased to compensate for this reduction of reflectivity. However, controlling the supplied power in this way necessitates sensing the temperature of substrate 9 with high precision and applying feedback to heater 4, which requires a very rigorous control precision.

The second problem is that particulates can be produced by parts of the deposited thin film peeling away, thereby impairing the quality with which substrate 9 is processed. If the thin films deposited at heated positions inside process chamber 1 reach this thickness, they can peel away either under their own weight or due to internal stress. Although heat-reflecting plate 6 suppresses the peeling of thin films to some degree since it is made of the same silicon material as substrate 9, as mentioned above, a silicon thin film is deposited in the same way as on substrate 9 since these positions have the same material as substrate 9 at their surface, and so the cumulative amount of deposition is higher than at other heated positions and peeling can easily occur due to internal stress.

Attempts have been made to make improvements by thermally oxidizing the surface of heat-reflecting plate 6 to cover it with a thermal oxide film and suppress the deposition of a silicon film on silicon heat-reflecting plate 6. If there is a film of silicon oxide at the surface, then this should suppress the deposition of a silicon film by the same mechanism as the selective deposition on substrate 9.

However, when a film is deposited on substrate 9 with, for example, a substrate temperature of 600° C. and a disilane flow rate of 12 sccm, the deposition of a thin film of silicon on the surface of heat-reflecting plate 6 was observed after performing film deposition processes on at most 5 substrates. Having completed film deposition on about 4000 substrates, it was confirmed that the film deposited on heat-reflecting plate 6 had peeled away, resulting in about 60 dust particulates adhering to the surface of substrate 9. These results show that even if the surfaces of parts made of silicon are covered with a film of silicon oxide, the cumulative amount of gas supplied can still exceed the conditions for selective deposition so that a silicon film is deposited.

In conventional apparatus, to suppress the problem of dust particulates generated due to peeling of thin films in this way, maintenance is performed after the film deposition process has been repeated a fixed number of times, in which the interior of process chamber 1 is opened to the atmosphere and the parts inside process chamber 1 are replaced. Process chamber 1 is then pumped down to an ultra-high vacuum, and the processing is restarted after confirming that there are no dust particulates and that the process can be performed repeatably. To perform this sort of maintenance, the apparatus must be taken out of service for 6 hours and worked on by 3 operators, requiring a total of 18 man-hours of labor. Consequently, this can seriously impair the productivity of the apparatus.

OBJECTS AND SUMMARY

The invention of the present application has been made to solve such problems. The invention of the present application relates to a thin-film deposition apparatus that performs selective deposition, and one of its aim is to provide a highly productive thin film deposition apparatus that can implement high-quality film deposition processes by suppressing the deposition of thin films on exposed positions inside the process chamber.

According to one embodiment of the present invention a thin film deposition apparatus utilizes a substrate having a first surface region made of a first material and a second surface region made of a second material that is different to the first material. The substrate is positioned inside a process chamber and introduces a reactive gas into this process chamber, and a difference in surface reactions between said first and second surface regions is exploited to deposit a thin film only on said first surface region. The apparatus is equipped with a reforming gas introduction system that introduces into said process chamber a reforming gas that either reforms the surfaces at exposed positions inside said process chamber so that they are made of said second material, or reforms them so that a similar difference in surface reactions as in the case of the second material is obtained.

The reforming involves causing a reaction whereby atoms or molecules of the first material that have been deposited on and adhered to said surfaces at exposed positions are converted into atoms or molecules of said second material.

The surface reaction is a thermal decomposition reaction wherein the difference in thermal decomposition reaction rates is used to selectively deposit a thin film, and said exposed positions are heated positions exposed to the interior of said process chamber.

The thin film is a silicon thin film, and said reactive gas is a gaseous hydride of silicon. The first material is silicon and said second material is silicon oxide or silicon nitride, and said reforming gas is oxygen gas, nitrogen gas, an oxidizing gas or a nitriding gas.

The surface of said exposed positions is covered beforehand with an oxide film or nitride film by an oxidizing process or a nitriding process.

The apparatus may be provided with a susceptor that holds said substrate inside said process chamber, and the surface of said exposed positions is the surface of this susceptor.

BRIEF DESCRIPTION OF THE FIGURES

FIGS. 2(1) through 2(4), 2(2–3'), 2(3'), and 2(4') illustrate the mechanism of reforming performed in apparatus in the present mode of implementation, and which shows the state at the surface of heat-reflecting plate 6 (the same applies to susceptor 3) which is covered with a silicon oxide film.

FIGS. 3(1) through 3(4), 3(2–3'), 3(3'), and 3(4') illustrate the mechanism of reforming performed in apparatus in the present mode of implementation, and which shows the state at the surface of a heated position made of a material other than silicon oxide.

DETAILED DESCRIPTION OF THE PREFERRED EMBODIMENTS

Figure 1:
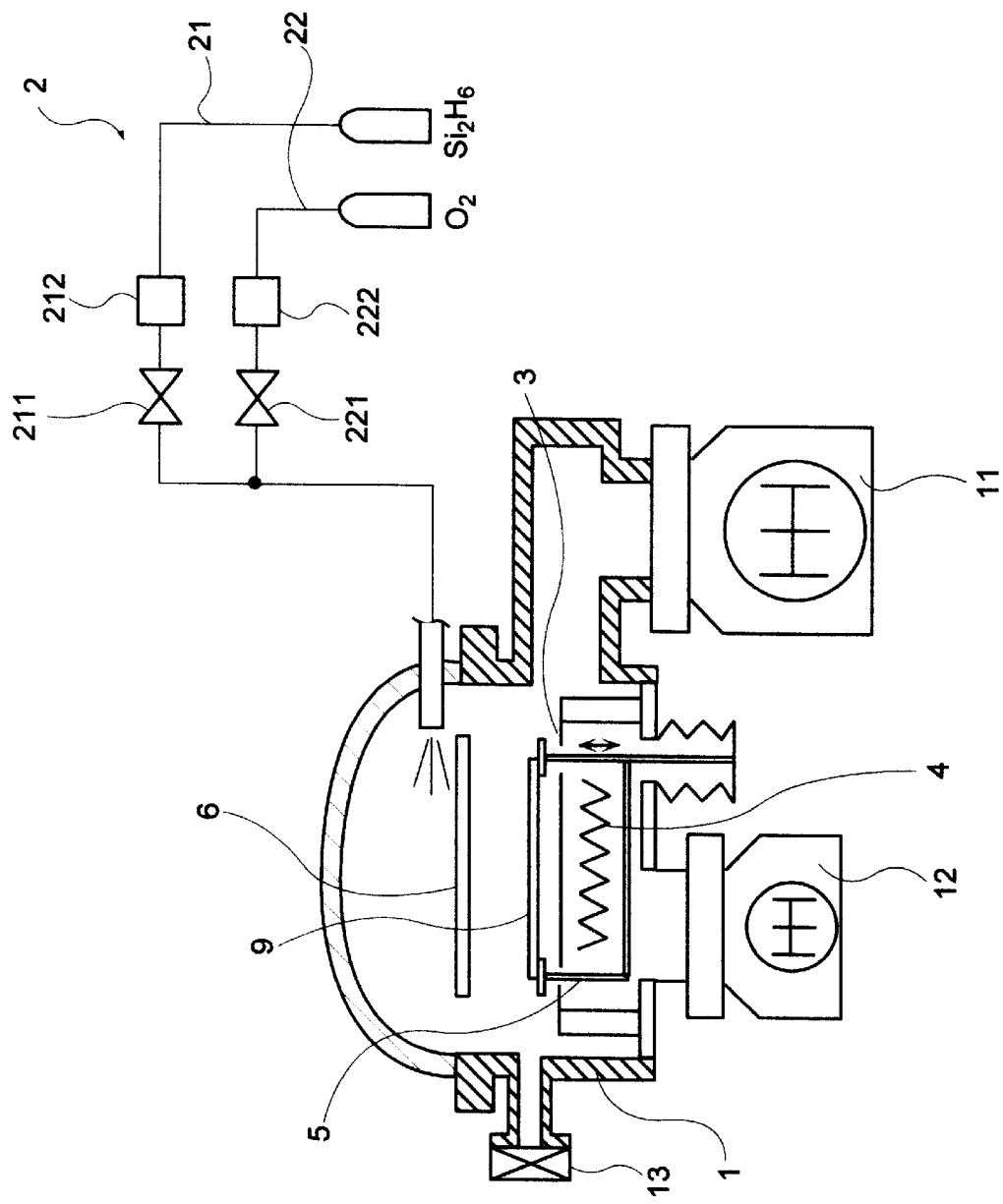
FIG. 1 is a front view outlining the configuration of a thin film deposition apparatus relating to a mode of implementation of the invention of the present application.

FIG. 1 is a front view outlining the configuration of a thin film deposition apparatus relating to a mode of implementation of the present invention. The thin film deposition apparatus shown in FIG. 1 has a process chamber 1 equipped with pumping systems 11 and 12. Process chamber 1 also has a gas introduction means 2 for introducing a process gas into the chamber. A susceptor 3 on which a substrate 9 is mounted, and a heater 4 which heats substrate 9, are disposed inside process chamber 1.

A heat-reflecting plate 6 and the susceptor 3 are made of silicon and their surfaces are subjected to an oxidizing process to cover their surfaces with a film of silicon oxide. The oxidizing process is performed by placing heat-reflecting plate 6 and susceptor 3 in an atmosphere of oxygen gas at a pressure of $10^{-5}$ Torr and leaving them for at most about 1 minute at room temperature or thereabouts. The thickness of the layer of silicon oxide at the surface is roughly the thickness of an atomic layer or less. A thickness of roughly the thickness of an atomic layer or less means that the thickness of the layer essentially does not exceed the thickness of a layer containing a single silicon atom and one or two oxygen atoms.

The configuration of gas introduction means 2 differs substantially from that of a conventional apparatus. Gas introduction means 2 has a disilane gas introduction system 21 and an oxygen gas introduction system 22. Each of the gas introduction systems 21 and 22 is independently provided with a valve 211 and 221 and a mass flow controller 212 and 222.

The operation of the apparatus of the present mode of implementation is described in the following.

First, silicon is selectively deposited on substrate 9 by closing valve 221 of oxygen gas introduction system 22 and introducing disilane gas by opening valve 211 of disilane gas introduction system 21. To precisely control the gas introduction time and the amount of gas introduced, valve 211 of disilane gas introduction system 21 is closed to stop the introduction of gas after a fixed time has elapsed.

After substrate 9 has been transferred out of process chamber 1 via gate valve 13, the following operation is performed before transferring the next substrate 9 into process chamber 1. The gate valve 13 through which substrate 9 was transferred out is closed and the interior of process chamber 1 is pumped down again, after which valve 221 of oxygen gas introduction system 22 is opened to introduce oxygen gas. The introduced oxygen gas reforms the surfaces of heated positions inside process chamber 1 by the following process.

FIGS. 2 and 3 illustrate the reforming mechanism performed in the apparatus of the present mode of implementation. FIG. 2 shows the variation with time of the state of the surface of heat-reflecting plate 6 (the same applies to susceptor 3) which is covered with a silicon oxide film 61, and FIG. 3 shows the variation with time of the state of the surface of heated positions that are made of a material other than silicon oxide.

FIG. 2 is used to describe the state of the surface of heat-reflecting plate 6. Once the film deposition on substrate 9 has been started by introducing the process gas, disilane is also supplied to the surface of heat-reflecting plate 6, which is also heated. The supplied disilane has a much slower thermal decomposition reaction rate than at the silicon surface of substrate 9. The disilane gradually decomposes, and silicon atoms start to separate out and adhere to the surface of silicon oxide film 61 (FIG. 2(1)). While the film is being deposited on substrate 9, the decomposition of disilane at the surface of heat-reflecting plate 6 gradually continues, and the number of silicon atoms that separate out and adhere to its surface also increases (FIG. 2(2)).

Up to this point, it is considered that the silicon atoms are chemically adsorbed to the silicon oxide film 61, and that essentially no reactive bonds occur between adjacent silicon atoms. Each individual silicon atom exists separately and independently on silicon oxide film 61. In other words, by the same mechanism as that of selective growth at the surface of substrate 9, the silicon atoms on silicon oxide film 61 do not build up to form a film as such.

The film deposition process on a single substrate 9 is finished when heat-reflecting plate 6 is in the state shown in FIG. 2(2). However, if the next substrate 9 is transferred into process chamber 1, more disilane will be supplied in the state shown in FIG. 2(2). If no reforming operation is performed, the buildatre-up on heat-reflecting plate 6 will continue as shown in FIGS. 2(3) and 2(4).

As the cumulative amount of disilane supplied increases, reactive bonds start to form between adjacent silicon atoms (FIG. 2(3)). At this point, the silicon atoms that have separated out and adhered to the surface of silicon oxide film 61 will start to form a film and the film deposition rate will increase sharply. The conditions for selective deposition break down once the cumulative amount of disilane supplied has exceeded the limit for selective deposition.

As the film deposition process on substrate 9 is repeated, the cumulative quantity of disilane supplied increases further still, and a silicon film 62 having a certain degree of thickness is formed (FIG. 2(4)). In this case, since the surface of heat-reflecting plate 6 is now composed of a silicon film, the disilane decomposes with a very high thermal decomposition reaction rate in the same way as the selective deposition on substrate 9. Once a silicon film 62 has been deposited, a thick film will be deposited within a short period of time. As mentioned above, the silicon film 62 deposited in this way reduces the repeatability of heating conditions of substrate 9 by changing the reflectivity of radiation, and the film can also peel away to produce dust particulates that cause surface defects on substrate 9.

On the other hand, in the present mode of implementation, oxygen gas is introduced between the states shown in FIGS. 2(2) and 2(3). After the film deposition process has been completed on a single substrate 9, oxygen gas is supplied to heat-reflecting plate 6 before starting the deposition process on the next substrate 9.

The supplied oxygen gas reacts with the silicon atoms that have individually adhered to the surface of heat-reflecting plate 6, thereby oxidizing these silicon atoms to form silicon oxide (FIG. 2(2–3')). Disilane gas is then supplied again during the film deposition process on the next substrate 9, but since almost all of the silicon atoms on the surface of heat-reflecting plate 6 have been converted to silicon oxide, no Si—Si bonds form as shown in FIG. 2(3). This case is similar to the state shown in FIG. 2(1). At the surface of silicon oxide film 61, the disilane decomposes with the same very slow thermal decomposition reaction rate, and silicon atoms only separate out from the disilane and adhere to the oxide film at a slow rate (FIG. 2(3')). Even when the film deposition process on this substrate 9 has been completed, the surface of heat-reflecting plate 6 will consist of a mixture of silicon oxide molecules and isolated silicon atoms.

Before another substrate 9 is processed, reforming is performed in the same way as before by introducing oxygen gas. As a result, the silicon atoms mixed in with the silicon oxide molecules are converted to silicon oxide by reacting with the oxygen in the same way as in FIG. 2(2–3'). By this process, the density of silicon oxide molecules increases so that a silicon oxide film 63 is formed (FIG. 2(4')).

In this way, a reforming operation in which oxygen gas is introduced is interspersed between the processes to deposit films on substrates 9. The reforming operation converts the silicon atoms that have adhered to the surface of silicon oxide film 61 into silicon oxide, forming a silicon oxide film 63. There is essentially no deposition of a silicon film 62 on the surface of heat-reflecting plate 6.

The deposited silicon oxide film 63 is made by oxidizing the silicon atoms that have separated out at a gradual rate within the scope of selective deposition, and thus the deposition rate after repeated film deposition processes on substrates 9 is very slow. Moreover, since the abovementioned silicon oxide film 63 is deposited on heat-reflecting plate 6 whose surface is already covered with a silicon oxide film 61, the thin film has good adhesion and the thin film does not peel away until the film has been deposited to a substantial thickness. Due to the deposition of silicon oxide film 63, the frequency with which heat-reflecting plate 6 must be replaced is much less than the frequency with which it must be replaced in a conventional apparatus in which a silicon film 62 would be deposited.

The effect of the reforming operation on the surface of the heat-reflecting plate 6 fitted to the apparatus is to gradually deposit a new silicon oxide film 63 on the surface of silicon oxide film 61. The surface of heat-reflecting plate 6 thus continues to be made essentially of silicon oxide. Accordingly, the present mode of implementation also effectively solves the problem of impaired repeatability in the heating conditions of substrate 9 due to changes in the reflectivity of radiation.

FIG. 3 is used to describe what happens at heated positions having materials other than silicon oxide at their surface.

During the process to deposit a film on substrate 9 as mentioned above, disilane gas is supplied to the surface of the heated positions made of stainless steel, whereupon silicon atoms separate out due to thermal decomposition of the disil.ane and adhere to the surface (FIGS. 3(1) and 3(2)). Since the separation and adhesion of these silicon atoms do not occur at a silicon surface, the reaction rate is similarly very low, and the deposition and adhesion occur at a very slow rate.

After the film deposition process has been completed on one substrate 9 and the film deposition process is performed on the next substrate 9 without performing a reforming operation with oxygen gas, Si—Si bonds will form at the surface of the stainless steel in the same way as in FIGS. 2(3) and 2(4), and a silicon film 71 will be deposited. Since disilane is supplied to the surface of this silicon film 71, the silicon film will grow at a fast rate in the same way as selective deposition at the surface of substrate 9. This silicon film 71 can peel away under its own weight or due to internal stress to form dust particulates which will cause surface defects on substrate 9.

If the abovementioned reforming operation is performed after completing the film deposition on substrate 9, the silicon atoms that have separated out and adhered to the stainless steel surface will react with the oxygen gas and will be converted into silicon oxide (FIG. 3(2–3')). In this state, the film deposition process is started on the next substrate 9, and more disilane gas is supplied to the stainless steel surface. Since almost all of the silicon atoms on the stainless steel surface have been converted to silicon oxide molecules, no Si—Si bonds form here and no silicon film 71 is deposited. In this case, the disilane decomposes at a very slow rate in the same way as in FIGS. 3(1) and 3(2), and the silicon atoms separate out only very slowly (FIG. 3(3')). When the reforming operation is repeated after completing the film deposition process on this substrate 9, the silicon atoms are converted to silicon oxide molecules and bond with the silicon oxide molecules that were formed there earlier.

By repeating the film deposition process on substrates 9 while interspersing them with reforming operations in this way, a silicon oxide film 72 is deposited on the surface of the heated positions made of stainless steel (FIG. 3(4')). However, as in the case of FIG. 2(4'), the deposition of silicon oxide film 72 at the heated positions occurs through the oxidation of silicon atoms that separate out and adhere at a slow rate within the scope of selective deposition, so that the deposition rate during repeated film deposition on substrates 9 is very slow. Accordingly, the frequency with which parts having these heated positions must be replaced or cleaned is much smaller than in the case where no reforming operation is performed. Furthermore, whereas the deposition of a silicon film 71 on the surface of the stainless steel can cause a sharp drop in reflectivity and alter the temperature of substrate 9, the formation of a silicon oxide film 72 makes the reduction in reflectivity much smaller and keeps this problem from occurring.

Since the gas introduction means 2 is equipped with an oxygen gas introduction system 22 and a reforming operation in which oxygen gas is introduced is performed between the film deposition process on each substrate 9, the deposition of films on the surface of heated positions inside process chamber 1 is suppressed. The frequency with which these parts must be replaced is markedly reduced, and the productivity of the apparatus is substantially improved.

An example of the present invention pertaining to the abovementioned mode of implementation is described in the following.

The apparatus of the abovementioned mode of implementation is able to operate under the following conditions. For the selective deposition of silicon on substrate 9, the temperature of substrate 9 is set to 600° C., the pressure inside process chamber 1 is set to $10^{-4}$ Torr, and disilane is supplied at a rate of 12 scam as the process gas. The process gas is introduced for one minute under these conditions, whereby it is possible to form epitaxial silicon film with a thickness of about 10 nm only on the silicon surface of substrate 9.

For the reforming operation, the substrate 9 on which the film deposition process has been performed is transferred out from process chamber 1, the interior of process chamber 1 is pumped down to about $10^{-8}$ Torr, and then oxygen gas is introduced at a rate of 2 scam and the pressure inside process chamber 1 is held at about $10^{-5}$ Torr. Heater 4 is operated in the middle of the reforming operation, whereby parts such as susceptor 3 and heat-reflecting plate 6 are heated by the heat from heater 4. The temperature of susceptor 3 is about 655° C., and the temperature of heat-reflecting plate 6 is roughly 200–300° C. The other heated positions are also heated to 70–100° C. or so. In this sort of reforming operation, the silicon atoms at the surfaces of heated positions such as susceptor 3 and heat-reflecting plate 6 are oxidized as described above and converted to silicon oxide molecules.

Figure 4:
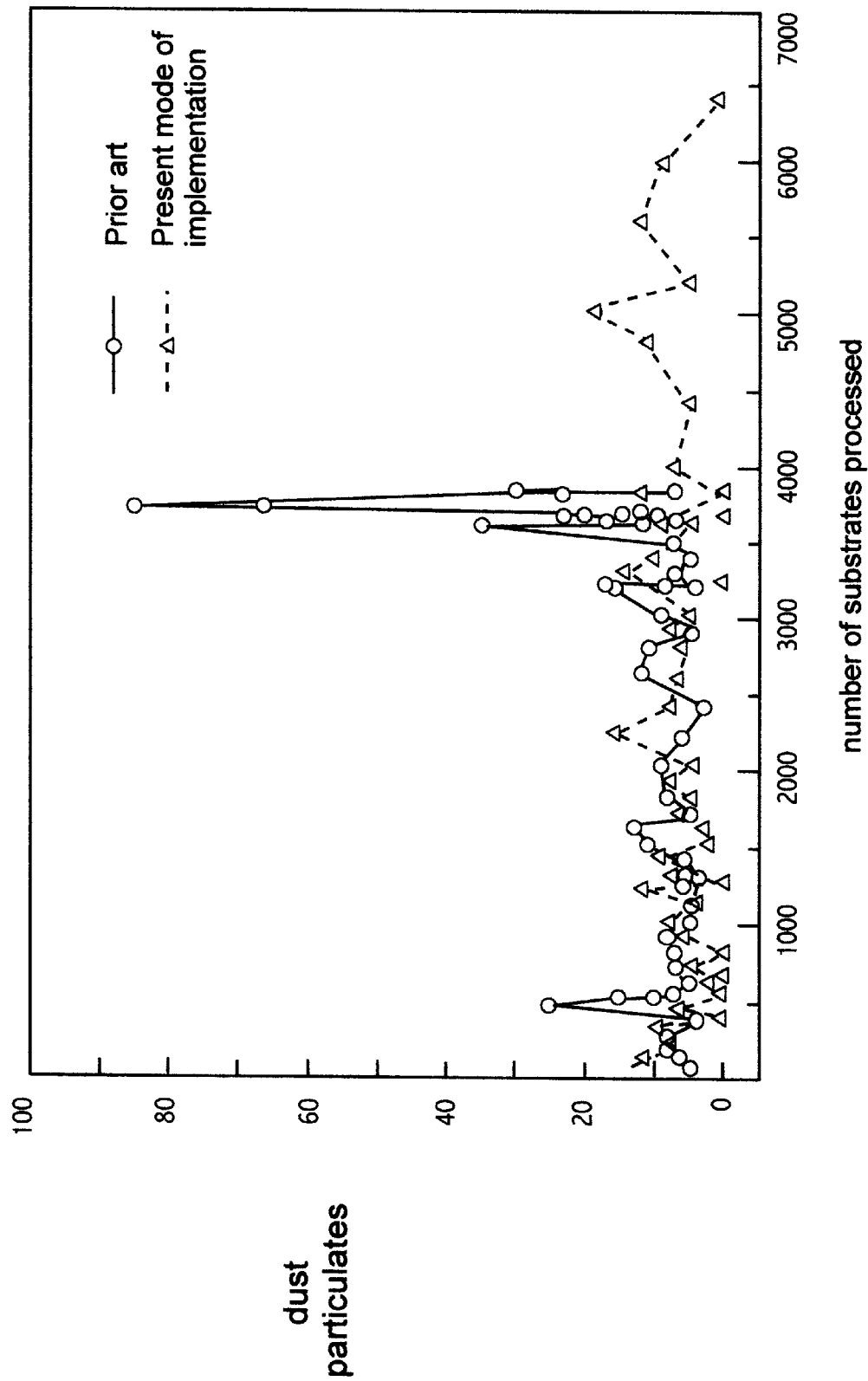
FIG. 4 illustrates the results of an experimental evaluation of the advantages of an apparatus according to the present mode of implementation.
Figure 5:
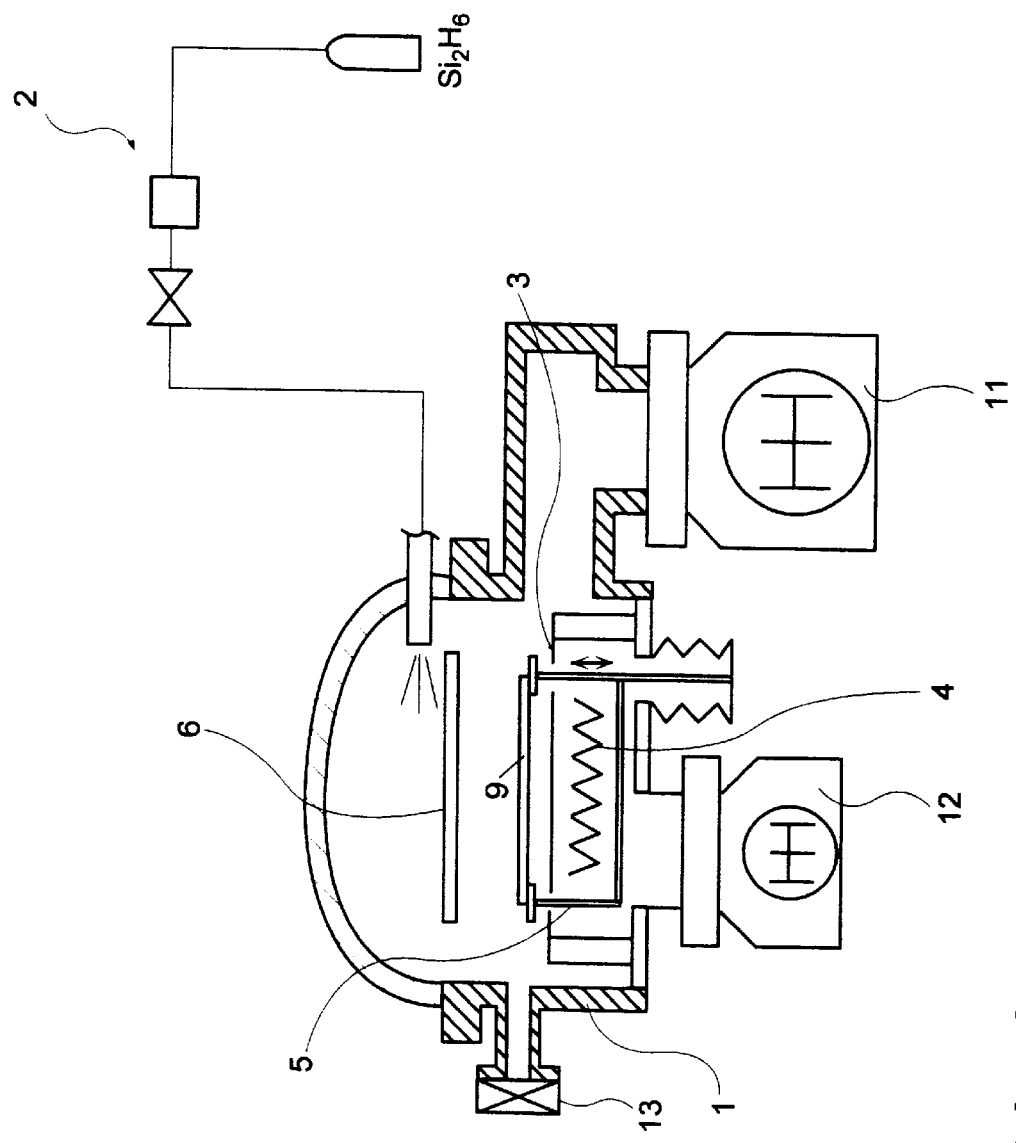
FIG. 5 is a front view outlining the configuration of a conventional thin film deposition apparatus used for the selective deposition of silicon.
Figure 6:
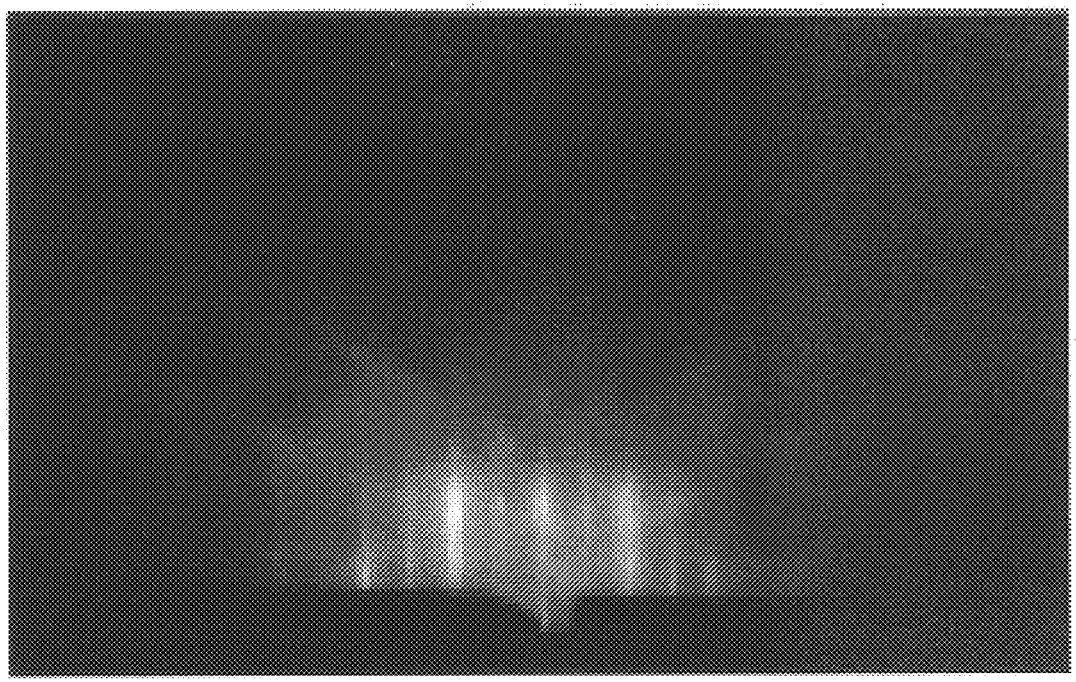
FIGS. 6(1) and 6(2) show the results of experimental selective deposition of silicon using the conventional apparatus shown in FIG. 5.
Figure 6:
Figure 7:
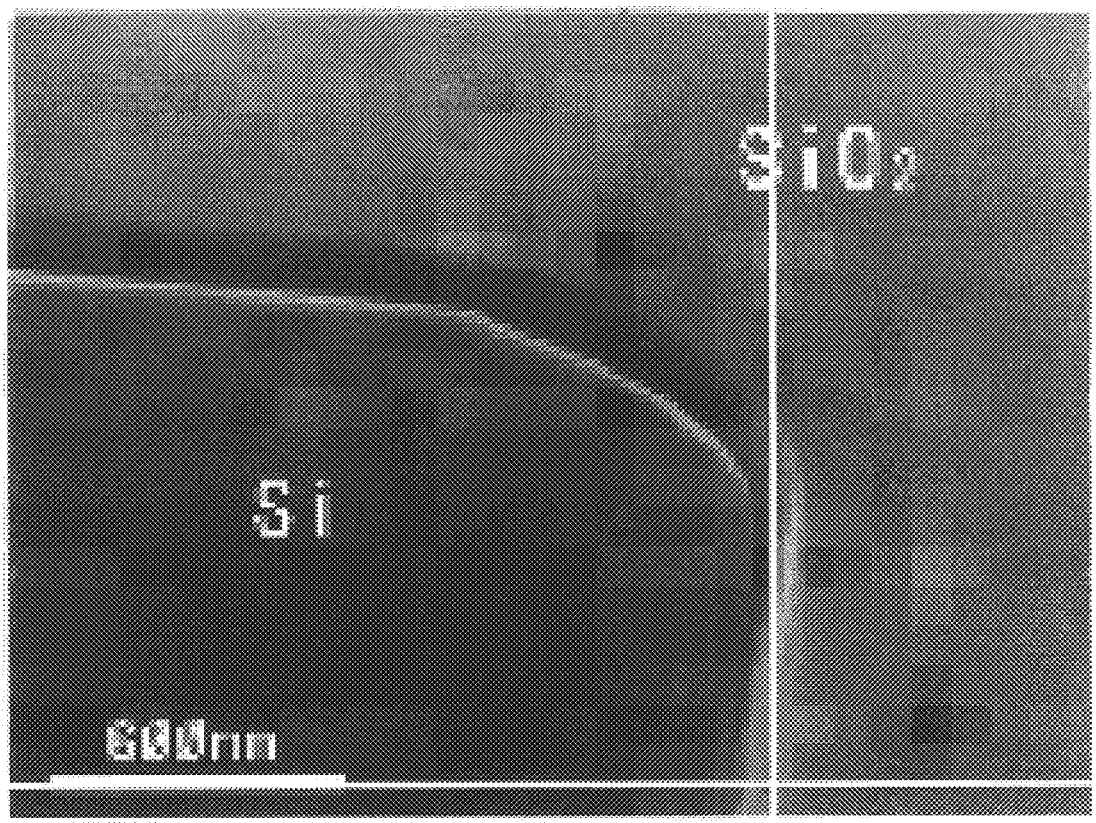
FIGS. 7(1) and 7(2) show the results of experimental selective deposition of silicon using the conventional apparatus shown in FIG. 5.
Figure 7:

FIG. 4 shows the number of dust particulates occurring when the film deposition process was performed on about 6500 substrates with a reforming operation performed between each of the processes to deposit films on substrates. The horizontal axis in FIG. 4 represents the number of substrates processed, and the vertical axis represents the number of particulates present on the surface of the substrate after each deposition process. By way of reference, FIG. 4 also shows the results obtained when repeated film deposition processes were performed without performing a reforming operation, as in a conventional apparatus.

As FIG. 4 shows, about 60 dust particulates were observed on the substrate surface after completing the film deposition process on 4000 substrates when the reforming operation was not performed. On the other hand, when the reforming operation was performed, the number of dust particulates was kept within 20 even after completing the film deposition process on 6500 substrates. This demonstrates that film deposition on parts such as heat-reflecting plate 6 was suppressed by the reforming operation.

Next, the stability of the power supplied to the heater in the apparatus of the present mode of implementation is described. In the apparatus of the present mode of implementation, heater 4 is subjected to feedback control by sensing the substrate temperature. While repeating the film deposition process on substrates under the conditions of the abovementioned embodiment, the power supplied to heater 4 with feedback in place was investigated and it was found that the change in power supplied to heater 4 was kept within 1% while processing 10,000 substrates. This means that the change in substrate temperature was also kept within 1%. This result was achieved because parts such as heat-reflecting plate 6 and susceptor 3 always had a film of silicon oxide at their surface so that there were no changes in the radiation reflectivity, and the substrate heating conditions were thereby kept stable and invariant over a long period of time.

Although oxygen gas was used in the reforming operation in the description of the abovementioned mode of implementation and embodiment, the same results can be achieved if nitrogen gas is used. When nitrogen gas is used, a flow rate of 2 sccm and a pressure of $10^{-5}$ Torr are suitable. Note that in this case silicon nitride should be formed beforehand at the surfaces of heat-reflecting plate 6 and susceptor 3, so that they are covered with a film of silicon nitride. A film of silicon nitride will then be gradually deposited at the surface of this heat-reflecting plate 6 and susceptor 3.

An oxidizing gas or nitriding gas can also be used instead of oxygen gas or nitrogen gas. Here, "oxidizing gas" and "nitriding gas" refer to "a gas that causes surface oxidization" and "a gas that causes surface nitriding". Specific examples might include $N_2O$, $NO_2$ and $NH_3$.

The abovementioned technique for the selective deposition of silicon can be used in HSG (hemispherical grain) processes to form textured polycrystalline silicon selectively on the surface of charge storage electrodes in memory elements, and in processes to fabricate a variety of silicon films by epitaxial silicon deposition for contact wiring to the source and drain channels of MOS-FETs (metal-oxide-silicon field effect transistors).

This technique can also be used for the selective deposition of other materials such as germanium (Ge) instead of silicon as mentioned above. For example, in the process to deposit a thin film of germanium only on the surface of Si, Ge or Si1–xGex (where 0<x<1) by thermal CVD using $GeH_4$ gas, the advantages such as reduction of dust particulates can be achieved by performing a reforming operation between processing episodes by introducing oxygen gas.

The reforming operation can also include reactions whereby molecules of a first material that separate out and adhere to the surface of exposed positions in process chamber 1 are reduced to form atoms differing from the first material, or reactions whereby molecules of a first material are converted to molecules of a second material differing from the first material.

Also, although the apparatus of the abovementioned mode of implementation was a cold-wall type of apparatus, the invention of the present application can be used to greater advantage in hot-wall types of apparatus where the wall surfaces of process chamber 1 are heated. In a hot-wall apparatus, the surface of process chamber 1 is heated to the same sort of temperature as substrate 9. Accordingly, it is more likely that silicon atoms will separate out and adhere to the wall surfaces of process chamber 1 due to decomposition of disilane than in a cold-wall type of apparatus. In this case, it is still possible to suppress the deposition of silicon films and suppress the occurrence of particulates by performing the abovementioned reforming process to convert the silicon atoms to silicon oxide molecules.

Furthermore, the invention of the present application can be applied in the same way to batch processing apparatus where a plurality of substrates are introduced into process chamber 1 and subjected to the film deposition process simultaneously, or to apparatus in which substrate 9 is fitted between a pair of heaters 4 above and below it.

In the above description, the selective deposition was performed by exploiting a difference in thermal decomposition reaction rates at the surface; however, the concept of the present invention is also applicable to other reactions besides thermal decomposition, such as active species produced by plasma, for example.

As described above, the invention of the present application is able to suppress the deposition of films on the surface of exposed positions inside the process chamber, thereby improving the repeatability of substrate heating conditions and substantially improving the productivity of the apparatus by greatly reducing the frequency with which parts must be replaced, and the like.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A thin film deposition apparatus for processing a substrate having a first surface region made of a first material and a second surface region made of a second material that is different than the first material, comprising:

a process chamber having exposed surfaces inside the process chamber;

means for positioning the substrate in the process chamber;

a reactive gas container containing reactive gas, which reactive gas exploits a difference in surface reactions between said first and second surface regions to deposit a thin film only on said first surface region;

a reactive gas introduction system that introduces the reactive gas into the process chamber;

a reforming gas container containing a reforming gas that either reforms the exposed surfaces inside said process chamber after being exposed to the reactive gas so that the exposed surfaces are made of said second material, or reforms the exposed surfaces inside said process chamber so that the exposed surfaces react as in the case of the second material;

a reforming gas introduction system that introduces into said process chamber the reforming gas.

2. The thin film deposition apparatus as claimed in claim 1, wherein said reforming gas is capable of causing a reaction whereby atoms or molecules of the first material that have been deposited on and adhered to said exposed surfaces are converted into atoms or molecules of said second material.

3. The thin film deposition apparatus as claimed in claim 1, wherein said reactive gas is a gaseous hydride of silicon and wherein said reforming gas is oxygen gas, nitrogen gas, an oxidizing gas or a nitriding gas.

4. The thin film deposition apparatus as claimed in claim 1, wherein the positioning means is a susceptor that holds said substrate inside said process chamber, and wherein the exposed surfaces are surfaces of the susceptor.

5. The thin film deposition apparatus as claimed in claim 1, further comprising timing means for controlling the timing of delivery of said reactive gas and said reforming gas into said process chamber.

6. The thin film deposition apparatus as claimed in claim 5, wherein said timing means times the delivery of the reactive gas and the reforming gas such that they are delivered at separate times.

7. A thin film deposition apparatus for processing a substrate, comprising:

a process chamber having surfaces inside the process chamber, said surfaces including an exposed layer of a first material;

means for positioning the substrate in the process chamber;

a reactive gas container containing a reactive gas, which reactive gas deposits a thin film of a second material on said substrate and deposits a second material onto the exposed layer;

a reactive gas introduction system that introduces the reactive gas into the process chamber;

a reforming gas container containing a reforming gas that reforms the exposed layer inside said process chamber after being exposed to the reactive gas so that the second material deposited on the exposed layer is reformed from the second material to the first material;

a reforming gas introduction system that introduces into said process chamber the reforming gas.

8. The thin film deposition apparatus as claimed in claim 7, wherein said reactive gas is a gaseous hydride of silicon and wherein said reforming gas is oxygen gas, nitrogen gas, an oxidizing gas or a nitriding gas.

9. The thin film deposition apparatus as claimed in claim 7, wherein the exposed layer is an oxide film or nitride film.

10. The thin film deposition apparatus as claimed in claim 7, further comprising timing means for controlling the timing of delivery of said reactive gas and said reforming gas into said process chamber.

11. The thin film deposition apparatus as claimed in claim 10, wherein said timing means times the delivery of the reactive gas and the reforming gas such that they are delivered at separate times.

* * * * *